United States Patent [19]

Gaalema et al.

[11] Patent Number: 4,755,676
[45] Date of Patent: Jul. 5, 1988

[54] INFRARED DETECTOR WITH IMPROVED HEAT DISSIPATION

[75] Inventors: Stephen D. Gaalema, Encinitas; Frank L. Augustine, Escondido, both of Calif.

[73] Assignee: Hughes Aircraft Company, Los Angeles, Calif.

[21] Appl. No.: 944,705

[22] Filed: Dec. 19, 1986

[51] Int. Cl.$^4$ ............................ G01J 1/00; G01T 1/22
[52] U.S. Cl. ................................ 250/352; 250/370.01
[58] Field of Search ............ 250/352, 370 L, 338 SE; 307/310

[56] References Cited

U.S. PATENT DOCUMENTS

| | | | |
|---|---|---|---|
| 4,421,985 | 12/1983 | Billingsley et al. | 250/352 |
| 4,488,414 | 12/1984 | Jungkman et al. | 250/352 |
| 4,621,279 | 11/1986 | Maier et al. | 250/352 |
| 4,645,931 | 2/1987 | Gordon et al. | 250/352 |

Primary Examiner—Janice A. Howell
Attorney, Agent, or Firm—Joseph E. Szabo; Kenneth W. Float; A. W. Karambelas

[57] ABSTRACT

An infrared detector has its sensor chip assembly (10,12,14) cooled to a relatively low temperature required for its operation, whereas a preamplifier (56) required to be positioned close to the sensor chip assembly and which generates considerably more heat than does the sensor chip assembly, is thermally isolated from the sensor chip assembly and its support (16) and is cooled to a higher temperature to thereby significantly reduce the power dissipated to the coldest refrigerator stage (90).

22 Claims, 2 Drawing Sheets

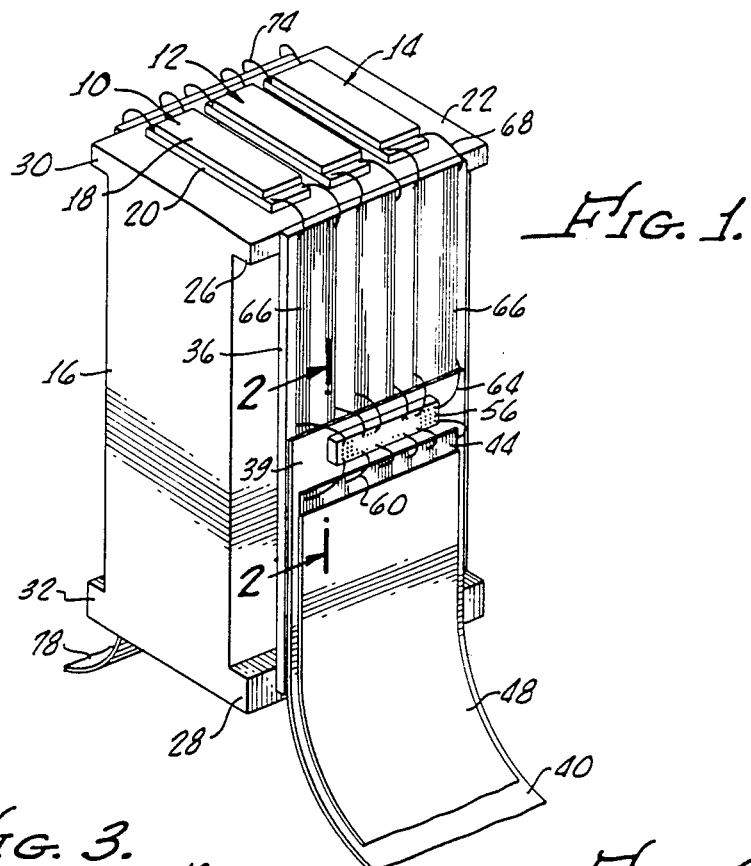
FIG. 1.
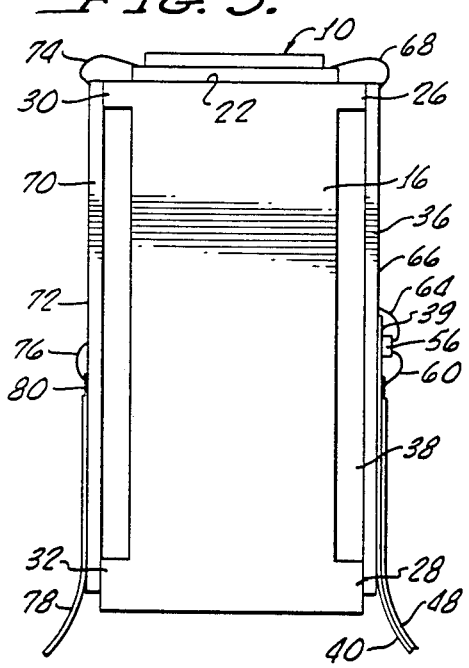
FIG. 3.
FIG. 2.

INFRARED DETECTOR WITH IMPROVED HEAT DISSIPATION

BACKGROUND OF THE INVENTION

1. Field of the Invention

This invention relates to low temperature circuit components, and more particularly concerns a low temperature electronic assembly having decreased cooling energy requirements.

2. Description of Related Art

Infrared assemblies used for detection of infrared energy frequently employ a sensor assembly comprising a detector array, a multiplexer for reading the array, and a preamplifier for increasing the very small output signal provided from the multiplexer. For optimum operation the detector must be maintained at a very low temperature. Current sensor technology limits effectively useful operation of an infrared sensor to a temperature not higher than about 10° K. Although operation at higher temperatures is preferable, sensor performance degrades and becomes unacceptable at higher temperatures. In the past a sensor assembly including a detector array, a multiplexer and preamplifier have been provided on integrated circuit chips packaged in proximity to one another and all mounted on a pedestal or module base for exposure of the detector array to heat energy that is to be sensed. All components of the chip package are cooled by conducting heat therefrom to the module base, which itself is maintained at the desired low temperature by thermally conductive connection to a suitable cryogenic refrigerator or other source of very low temperature. Significant amounts of energy are required to maintain a temperature as low as 10° K., and thus a major limitation upon size, life and application of infrared sensor devices is the amount of cooling, and thus, the amount of input energy required.

Accordingly, it is an object of the present invention to provide a low temperature electronic assembly in which cooling energy requirements are decreased.

SUMMARY OF THE INVENTION

In carrying out principles of the present invention, in accordance with a presently preferred embodiment thereof, a first electrical circuit component is mounted on a module base in heat conductive relation thereto, and the base is cooled to a very low temperature. A second electrical circuit componet having electrical connection to the first circuit component is mounted upon the base in substantial thermal insulation therefrom, and the second circuit component is cooled to a temperature higher than the low temperature of the first circuit component. According to one specific feature of the invention, an infrared sensor has a sensor assembly comprising a detector array and multiplexer mounted in good thermal contact with the end of a module base. A preamplifier for the assembly is also mounted to the base, close to the multiplexer, but in thermal isolation therefrom. Electrical leads of low thermal conductivity connect the preamplifier with the multiplexer. The module base is maintained at the low temperature required for operation of the detector array, but the preamplifier, which may generate considerably more heat than the sensor assembly, is maintained at a temperature considerably higher than the low temperature at which the base is maintained. This is achieved by thermally isolating the preamplifier from the base and by thermally connecting the preamplifier to a heat sink that is maintained at a temperature above the temperature of the module base.

BRIEF DESCRIPTION OF THE DRAWINGS

FIG. 1 is a pictorial illustration of a module base having circuit elements arranged thereon in accordance with principles of the present invention;

FIG. 2 is a section taken on lines 2—2 of FIG. 1;

FIG. 3 is a side elevational view of the module of FIG. 1; and

DESCRIPTION OF A PREFERRED EMBODIMENT

Figure 4:
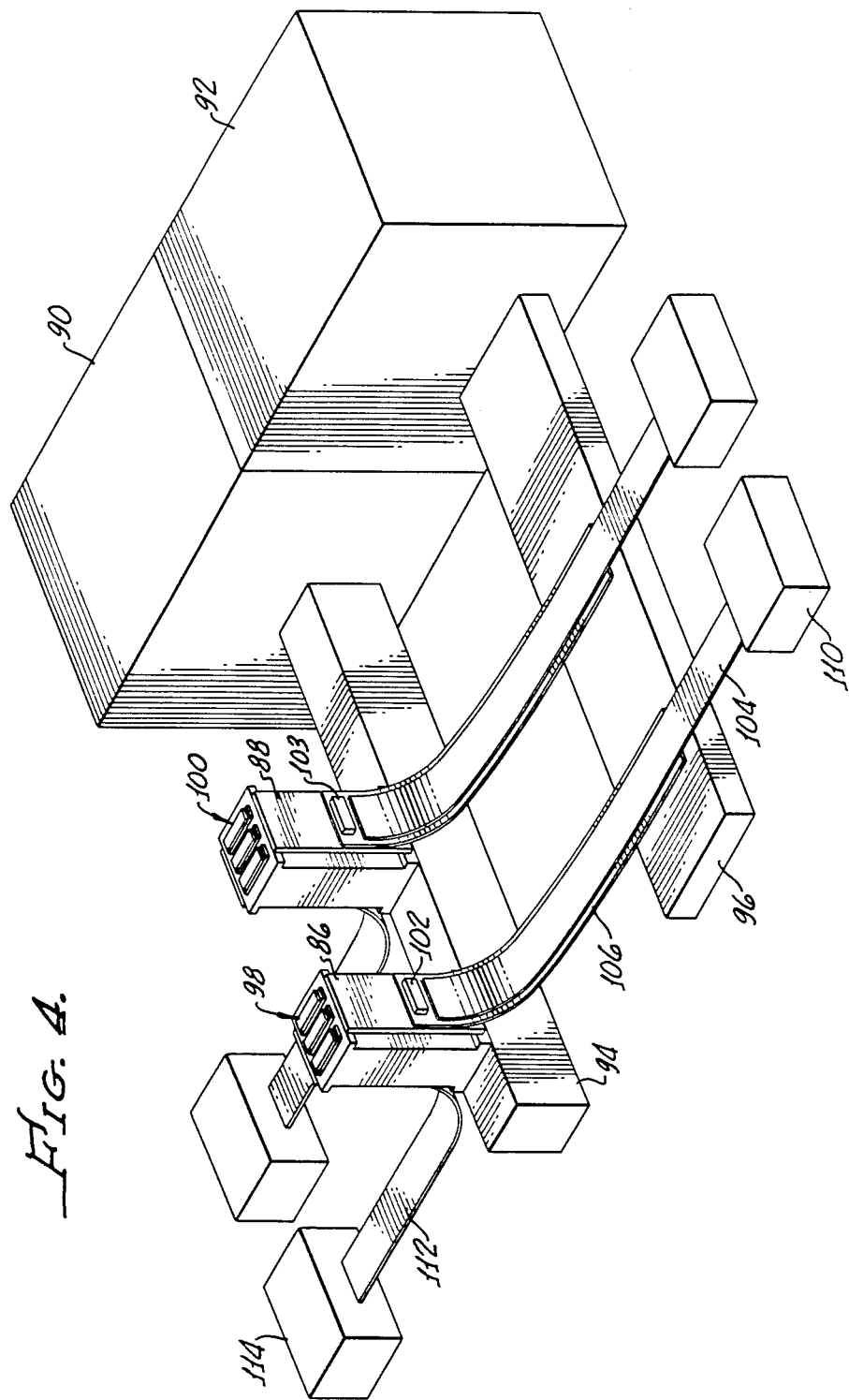
FIG. 4 is a schematic pictorial illustration of parts of an infrared detector embodying principles of the present invention.

As illustrated in FIG. 1, a plurality of sensor chip assemblies 10,12,14 are mounted on the face of an end of a module base or pedestal 16 made of a material having high thermal conductance, such as tungsten. The base is cryogenically cooled to a temperature, such as, for example, about 10° K., which is required for optimum operation of the sensor chip assemblies. The sensor chip assemblies are all alike and each includes a first chip 18 containing semiconductor elements that respond to infrared energy by generating an electrical output signal. The chip 18 is combined with and mounted upon a multiplexer chip 20, which is adhesively secured to the upper surface 22 of the end of base 16 by means of a suitable epoxy adhesive having high thermal conductance.

Because the signal coming from the multiplexer, which electronically scans the output of the semiconductor detector element array, is of such a small magnitude, a preamplifier is required which must be positioned close to the multiplexer to minimize capacitative load. In prior arrangements the preamplifier has been effectively packaged with the semiconductor detector element array and the multiplexer, all being mounted together on the module base for common cryogenic cooling to the temperature of the module base.

According to one feature of the present invention, however, a preamplifier chip is mounted to the module base in proximity to the detector array and muliplexed but is thermally insulated from the module base and its detector array and multiplexer, so that the preamplifier chip can be cooled to a considerably higher temperature than the temperature of the detector array and module base. This arrangement provides an important improvement in cooling energy requirements since it is found that the preamplifier itself is responsible for more than eighty percent (80%) of the total power dissipation of the combination of detector array, multiplexer and preamplifier. Thus, according to this feature of the invention, the preamplifier chip, positioned very close to the sensor chip assembly 18,20, is thermally insulated from the module base, detector array and multiplexer, and is maintained at a higher temperature by conducting heat, via a high thermal conductance heat path, from the preamplifier to a higher temperature refrigerator or to a higher temperature stage of the same refrigerator which cools the base module.

To this end the module base 16 is formed with laterally outwardly projecting integral mounting bosses in the form of continuous flanges 26,28 on upper and lower ends of one side of the module base, and flanges 30,32 on upper and lower ends of the other side of the base. The flanges of the pair 26,28 are spaced apart, and the flanges of pair 30,32 are likewise spaced apart, for substantially the entire height of the module base. Fixedly secured to module base projections 26,28, as by suitable low temperature adhesive of low thermal conductance, is a rigid thermally insulating fanout in the form of a quartz plate 36 covering a major portion of the side of the module base and spaced therefrom by a space 38 for the greater portion of its area. Adhesively secured to the quartz fanout plate 36 is the upper end 39 of a heat sink 40, of high thermal conductance, in the form of a copper strip having a width nearly equal to the width of the quartz fanout plate.

A ribbon cable 42 having a plurality of electrical conductor traces 44 sandwiched between electrical insulation layers 46,48 (FIG. 2), is adhesively secured over an area adjacent one end 50 thereof to the copper heat sink strip 40 at a distance from the upper end 39 of the heat sink strip 40. A preamplifier chip 56, adjacent the end of the ribbon cable, is adhesively secured to, and in good thermal contact with, the heat sink strip 40 at the end 39 thereof that is secured to the quartz fanout plate 36. Wire bonds 60 electrically connect the preamplifier chip to the ribbon cable conductors 44. Similar wire bonds 64 electrically connect the preamplifier chip to a plurality of electrically conductive traces 66 which extend from preamplifier chip 56 to the group of sensor chip assemblies 10,12 and 14. Traces 66 are electrically connected to sensor chip assemblies by wire bonds 68, thereby electrically interconnecting the preamplifier chip with the sensor chip assemblies. Traces 66 are preferably formed of a titanium/nickel composition provided on the surface of the fanout quartz plate 36 by conventional etching or equivalent techniques for forming circuit leads. The titanium/nickel traces have good electrical conductivity and have relatively low thermal conductance, thereby minimizing heat flow between the colder sensor chip assemblies 10,12,14 and the less cold preamplifier chip. If deemed necessary or desirable, thermal insulation of the preamplifier chip 56 from the module base 16 may be enhanced by interposing an additional block (not shown) of low thermal conductance between the preamplifier and the quartz plate 36, to which the preamplifier is mounted.

On the other side of the module base, adhesively secured to projections 30,32, is a second quartz fanout plate 70, of low thermal conductance, having a plurality of electrically conductive titanium/nickel traces 72, similar to traces 66, formed on its surface. The upper ends of traces 72 are connected by wire bonds, indicated at 74, to the multiplexers of the sensor chip assemblies 10,12 and 14. Traces 72 are also connected by wire bonds 76 to an input cable 78 having an end 80 adhesively secured to quartz fanout plate 70 adjacent the point of connection to wire bonds 76. Input cable 78 has a low thermal conductance to decrease heat flow between the relatively remote input circuitry and the sensor chip assemblies 10,12 and 14.

Electrically, power and multiplexer control signals are fed via input cable 78 and traces 72 to the multiplexers of the chip assemblies 10,12 and 14, and outputs of the multiplexers are fed via the traces 66 to preamplifier chip 56 from which electrical signal outputs are fed to relatively remote output circuitry via the conductors 44 of the output ribbon cable 42.

Thus it will be seen that the semiconductor detector array and multiplexer assemblies can be maintained at a very low sensor temperature, such as the required 10° K. temperature, while the preamplifier, utilizing considerably more power and thus generating considerably more heat, is mounted in close proximity to the sensor chip assemblies, but nevertheless is thermally insulated therefrom so that it need be cooled only to a higher temperature. The electrical connecting paths between the preamplifier and the multiplexers are kept short, but are of low thermal conductance to assist in maintaining the temperature difference between the sensor chip assembly and the preamplifier. Similarly electrical signal paths between input circuitry and the sensor chip assemblies are thermally insulated by quartz plate 70 from the low temperature module base, and moreover, are themselves of low thermal conductance, to thereby decrease flow of heat along the input cable to the module base and sensor chip assemblies. The preamplifier output ribbon cable has a high thermal conductance, and together with the copper heat sink strip that is secured in good thermal connection with the preamplifier chip, helps to remove heat from the preamplifier, which heat flows to the higher of the two cryogenic refrigerators.

It will be understood that there are many different arrangements known to those skilled in the art by which the module base 16 and the sensor chip assemblies mounted thereon may be maintained at the very low temperature, while the adjacent preamplifier, thermally insulated from the sensor chip assemblies and module base, may be maintained at a higher temperature. Illustrated in FIG. 4 is a schematic showing of one such an arrangement for providing two different refrigerator stages, or two different refrigeration sources for the module base and the preamplifier respectively. FIG. 4 schematically illustrates a first refrigerator 90 which is the lower temperature refrigerator, capable of cooling to a temperature of about 10° K., and a second intermediate temperature refrigerator 92, capable of cooling to a higher temperature such as about 30° K. The refrigerators may be separate devices or a single refrigerator having two or more stages of refrigeration. A suitable multi-stage refrigeration system is made by Hughes Aircraft Company and designated as a high capacity space borne Vuilleumier refrigerator, model 10VM-B. This refrigerator has three stages, delivering cryogenic refrigeration capacity simultaneously at three levels, i.e., 0.3 watts at 11.5° K., 10 watts at 33° K., and 12 watts at 75° K.

Thermally connected to refrigerators 90 and 92 respectively are heat sink bars 94 and 96 of high thermal conductance. Mounted upon the heat sink bar 94, in good thermal contact therewith, are a plurality of module bases or pedestals 86,88 each identical to module base 16 of FIG. 1, and each having a plurality of sensor chip assemblies 98,100 and preamplifiers 102,103 constructed and arranged as are the corresponding components of FIG. 1. Thus bases 86 and 88 are cooled by the lower temperature refrigerator or stage 90. Two module bases (and electrical components and connections) are shown only for purposes of exposition, as the numer of such bases is but a matter of choice or design. An output cable 104 and heat sink strip 106 identical to cable 42 and strip 40 of FIGS. 1–3 are connected between the quartz fanout plate on base 86 and the second heat sink bar 96 with which the heat sink strip 106 is in good thermal contact. Thus the preamplifier is cooled by the higher temperature refrigerator or stage 92. Ribbon cable 104 is connected to output circuitry indicated generally at 110. An input cable of low thermal conductance 112, like the previously described input cable 78, is connected between suitable input and control circuitry 114 and the quartz fanout plate on the other side of base module 86. The components on base 88 are connected in the same way as the components on base 86.

There have been described arrangements for reducing power dissipation in a cryogenically cooled infrared detection system, without degrading optimum electrical performance of sensor chips and still retaining close proximity of the preamplifier chip. The arrangement provides for the optimum cooling of the sensor chips but significantly decreases thermal load on the cryogenic cooling system which is added by the relatively higher powered preamplifier chip by thermally insulating the preamplifier from the sensor module base and dissipating its heat to a higher temperature refrigerator.

What is claimed is:

1. A low temperature assembly comprising:
   (a) a module base,
   (b) a first electrical circuit component mounted on the base in heat conductive relation thereto,
   (c) means for cooling said base to a first low temperature to thereby maintain said first circuit component at such first low temperature,
   (d) a second electrical circuit component having electrical connection to said first circuit component,
   (e) means for mounting said second circuit component upon said base in substantial thermal insulation therefrom, and
   (f) means for cooling said second circuit component to a second temperature above said first low temperature and below ambient temperature.

2. The low temperature assembly of claim 1 wherein said means for cooling said base comprises a first refrigeration source thermally coupled to said base, and wherein said means for cooling said second circuit component comprises a second refrigeration source having a temperature above the temperature of said module base, and means for thermally coupling said second circuit component to said second refrigeration source.

3. The low temperature assembly of claim 2 wherein said first electrical circuit component comprises an infrared detector array and a multiplexer chip, and wherein said base has a front end and sides, said detector array and multiplexer being mounted on said front end, and said preamplifier being mounted on one of said sides.

4. The low temperature assembly of claim 3 wherein said electrical connection comprises a thermally and electrically nonconductive substrate having a plurality of electrically conductive lines formed therein, said electrically conductive lines having low thermal conductance.

5. The low temperature assembly of claim 4 wherein said substrate and conductive lines comprise a quartz plate having a plurality of electrically conductive traces formed on a surface thereof.

6. A method of cooling an infrared sensor assembly of the type wherein a sensor chip and and preamplifier chip are mounted on a module base and electrically interconnected with one another, said method comprising the steps of:
   (a) mounting the sensor chip on the module base in thermally conductive relation thereto,
   (b) mounting the preamplifier chip on the module base adjacent the sensor chip and in thermal isolation from the module base and sensor chip,
   (c) cooling said module base to a first low temperature required for operation of said sensor chip, and
   (d) cooling the preamplifier chip to a second low temperature above said first low temperature.

7. The method of claim 6 including the step of electrically connecting said sensor and preamplifier chips by electrically conductive traces of low thermal conductance.

8. The method of claim 7 wherein said step of mounting said preamplifier chip comprises fixing a body of low thermal conductance to said module base, and mounting said preamplifier chip on said body, said step of electrically connecting including forming said electrically conductive traces on said body.

9. Apparatus for cooling first and second electronic components of a system operating in an environment having an ambient temperature, wherein the first of said components is to be cooled to a first predetermined temperature that is extremely low relative to said ambient temperature, and wherein the second component generates significantly more heat than said first component, said apparatus comprising:
   (a) cooling means having first and second refrigeration sources, said first source being maintained at said first predetermined temperature, and said second source being maintained at a second predetermined temperature above said first temperature and below said ambient temperature,
   (b) a base of high thermal conductivity thermally coupled to said first source,
   (c) means for mounting said first component on said base in good thermal contact therewith,
   (d) thermal isolating means for mounting said second component on said base near said first component in thermal isolation from said base, and
   (e) conduit means for thermally coupling said second component to said second refrigeration source.

10. The apparatus of claim 9 characterized further in that said base comprises a metal block and said thermal isolating means comprises a quartz plate mounted on said block.

11. The apparatus of claim 10 characterized further in that said quartz plate carries electrically conductive traces of low thermal conductivity for establishing part of an electrical path between said components while minimizing heat transfer from said second component to said first component.

12. The apparatus of claim 11 characterized further in that said conduit means comprises a thermally conductive metal strip mounted at one end of said quartz plate, said second component being mounted on and thermally coupled to said metal strip near said one end.

13. An electronic module for use with a cryogenic cooling system having first and second cooling stages wherein the second stage is cooled to a higher temperature than said first stage, said module comprising:
   (a) a thermally conductive base,
   (b) means for thermally coupling said base to said first cooling stage,
   (c) a first electronic component mounted on and thermally coupled to said base,
   (d) a thermally insulative member mounted on said base,
   (e) a second electronic component mounted on said thermally insulative member and spaced from said first electronic component,
   (f) means for electrically interconnecting said first and second components, (g) means for electrically connecting said first electronic component to auxiliary circuitry remote from said module, and (h) thermally conductive means thermally coupled to said second component for conducting heat therefrom to said second cooling stage.

14. The electronic module of claim 13 characterized further in that said base is a block having mounting surfaces extending from its side, and in that said thermally insulative member comprises a quartz plate secured to said mounting surfaces so as to span a side of said block in spaced relation thereto.

15. The electronic module of claim 14 characterized further in that said thermally conductive means comprises a thermally conductive strip anchored at one end on said quartz plate, and said second electronic component is mounted on said thermally conductive strip near said one end so as to be thermally coupled thereto.

16. The electronic module of claim 14 characterized further in that said block is made of tungsten having an I-shaped cross section, and having top and bottom cross members forming said mounting surfaces.

17. The electronic module of claim 13 characterized further in that said thermally insulative member is a quartz plate, and said electrically interconnecting means include traces composed of a mixture of titanium and nickel formed on said plate.

18. The electronic module of claim 13 characterized further in that said electrically interconnecting means includes electrically conductive links of low thermal conductivity to prevent heat leakage from said second electronic component to said first electronic component.

19. The electronic module of claim 13 characterized further in that said module includes a second thermally insulative member mounted on said base, and in that said electrically interconnecting means include electrically conductive paths of low thermal conductivity to minimize heat flow to said first electronic component, said electrically conductive paths being electrically connected to said first electronic component.

20. The electronic module of claim 19 charcterized further in that said block is I-shaped in cross section having upper and lower lateral cross members forming extensions on which said first and second insulative members are mounted so as to extend along opposite sides of said block in spaced relation to the sides of the block for a major portion of the extent of the block.

21. For use with an electronic component assembly having a base cryogenically cooled to a component operating temperature, a first component mounted on the base in thermal contact therewith and cooled by the base to the component operating temperature, and a second electronic component having electrical connection with said first component, an improved method for cooling said second component comprising the steps of:

(a) mounting a thermal insulating body to said base adjacent said first component, (b) mounting said second component to said body adjacent said first component, and (c) cryogenically cooling said second component to a second temperature above said operating temperature.

22. The method of claim 21 including the step of forming said electrical connection of material having low thermal conductance to decrease transfer of heat between said components.

* * * * *